(12) United States Patent
Nicollini et al.

(10) Patent No.: US 8,044,718 B2
(45) Date of Patent: Oct. 25, 2011

(54) INTEGRATED PROGRAMMABLE GAIN AMPLIFIER CIRCUIT AND SYSTEM INCLUDING THE CIRCUIT

(75) Inventors: Germano Nicollini, Piacenza (IT); Angelo Nagari, Cilavegna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 12 days.

(21) Appl. No.: 12/637,091

(22) Filed: Dec. 14, 2009

(65) Prior Publication Data

US 2010/0156535 A1 Jun. 24, 2010

(30) Foreign Application Priority Data

Dec. 15, 2008 (IT) .................... RM 2008 A 000664

(51) Int. Cl.
*H03F 1/36* (2006.01)
(52) U.S. Cl. ............................... 330/86; 330/254
(58) Field of Classification Search .............. 330/86, 330/254, 69, 260
See application file for complete search history.

(56) References Cited

U.S. PATENT DOCUMENTS

| | | | | |
|---|---|---|---|---|
| 6,407,658 B2 * | 6/2002 | Kuo | | 327/552 |
| 7,068,108 B2 * | 6/2006 | Xu et al. | | 330/284 |
| 7,414,467 B2 * | 8/2008 | Blon | | 330/69 |
| 7,852,158 B2 * | 12/2010 | Kobayashi et al. | | 330/260 |
| 2005/0179505 A1 | 8/2005 | Di Giandomenico et al. | | 333/17.1 |
| 2006/0103469 A1 | 5/2006 | Chandra et al. | | 330/303 |
| 2007/0132507 A1 | 6/2007 | Gatta et al. | | 327/552 |

FOREIGN PATENT DOCUMENTS

EP 0421423 4/1991

* cited by examiner

*Primary Examiner* — Henry Choe
(74) *Attorney, Agent, or Firm* — Lisa K. Jorgenson; E. Russell Tarleton; Seed IP Law Group PLLC

(57) ABSTRACT

An integrated programmable gain amplifier circuit that receives at an input an analog signal, circuit including an operational amplifier and a gain setup network comprising resistive elements and selection elements, which may be controlled in order to setup the gain of the amplifier circuit. The gain setup network further includes capacitive elements, for defining, together with the resistive elements and the operational amplifier, an anti-aliasing filter of the active RC type.

22 Claims, 3 Drawing Sheets

INTEGRATED PROGRAMMABLE GAIN AMPLIFIER CIRCUIT AND SYSTEM INCLUDING THE CIRCUIT

BACKGROUND

1. Technical Field

The present disclosure refers to an integrated programmable gain amplifier circuit and to a system including such an integrated circuit.

2. Description of the Related Art

With reference to the block diagram shown in FIG. 1, transmission and recording systems 1 are known in the field of mobile telephony voice/audio for receiving at input a microphone analog signal in order to convert it into a digital signal. The system includes an integrated circuit in which a programmable gain amplifier 2 (which in this configuration is commonly called pre-amplifier), an anti-aliasing filter 3, and an analog-digital converter 4 are provided.

In such transmission or recording systems 1, the pre-amplifier 2 is of the programmable gain type, in order to adapt the dynamics of the microphone signal, depending on the particular type of microphone used, to the input dynamic of the analog-digital converter 4. The gain of the pre-amplifier 2 is set during system setup in order to provide the best performing interfacing of the analog-digital converter 4 to the particular microphone model to be used in the system.

The anti-aliasing filter 3 has the task of eliminating the spurious components of the input microphone signal that surround the sampling frequency of the analog-digital converter in order to avoid these components from being carried in the band used by the sampling operation. Such a filter 3 is therefore a low pass filter.

The analog-digital converter 4 is provided for converting the preamplified and filtered analog microphone signal into a digital signal, for example in order to store or transmit this digital signal.

In designing next-generation mobile communications devices, such as cellular telephone devices, for which audio performances will be required, which may be similar to those of consumer hi-fi equipments, the need is felt for reducing the noise introduced in the digital samples by the path through the various blocks 2, 3, and 4 represented in the diagram of FIG. 1.

It has been observed that in order to achieve this goal, it is necessary to develop integrated circuits with an increase of consumption and surface area of the three blocks 2, 3 and 4 of FIG. 1, since the noise decreases with the square root of the these two parameters. However, this solution is not practical since, in order to achieve the required performances in terms of noise reduction, it would be necessary to design mobile communications devices with an unacceptable level of consumption, although it is known that the battery consumption is a very important performance factor, and it would be necessary to develop integrated circuits that are not competitive in terms of silicon area requirements.

BRIEF SUMMARY

The present disclosure provides a circuit that provides a sufficient noise reduction while at the same time not requiring an increase in consumption and area or requiring only a relatively limited consumption and area increase.

In accordance with one embodiment, an integrated programmable gain amplifier integrate circuit as defined in the claims is provided.

In accordance with one embodiment, an integrated programmable gain amplifier circuit for receiving at an input an analog signal is provided. The circuit includes an input for receiving an analog signal, the circuit comprising an operational amplifier and a gain setup network comprising resistive elements and selection elements, that are controlled to setup gain of the amplifier circuit, the gain setup network including capacitive elements, for defining, together with the resistive elements and the operational amplifier, an anti-aliasing filter of the active RC type.

In accordance with another embodiment of the present disclosure, a circuit is provided that includes an anti-aliasing filter of the active RC type that includes an amplifier; and a gain network that includes an input network coupled to a first input of the amplifier, and a feedback network coupled between an output of the amplifier and a second input of the amplifier, the feedback network comprising a plurality of RC cells coupled in cascode, each RC cell associated with a respective selection switch to selectively couple each of the plurality of RC cells in the cascode connection.

In accordance with yet a further embodiment of the present disclosure, a mobile communications device is provided that includes an anti-aliasing filter of the active RC type that includes an amplifier; and a gain network that includes an input network coupled to a first input of the amplifier, and a feedback network coupled between an output of the amplifier and a second input of the amplifier, the feedback network comprising a plurality of RC cells coupled in cascode, each RC cell associated with a respective selection switch to selectively couple each of the plurality of RC cells in the cascode connection.

BRIEF DESCRIPTION OF THE SEVERAL VIEWS OF THE DRAWINGS

The disclosure will be better understood from the following detailed description of one preferred embodiment, which is illustrative and therefore in no way limiting with respect to the appended drawings, wherein.

In the various figures, same or like elements are indicated by the same reference numerals.

DETAILED DESCRIPTION

Figure 1:
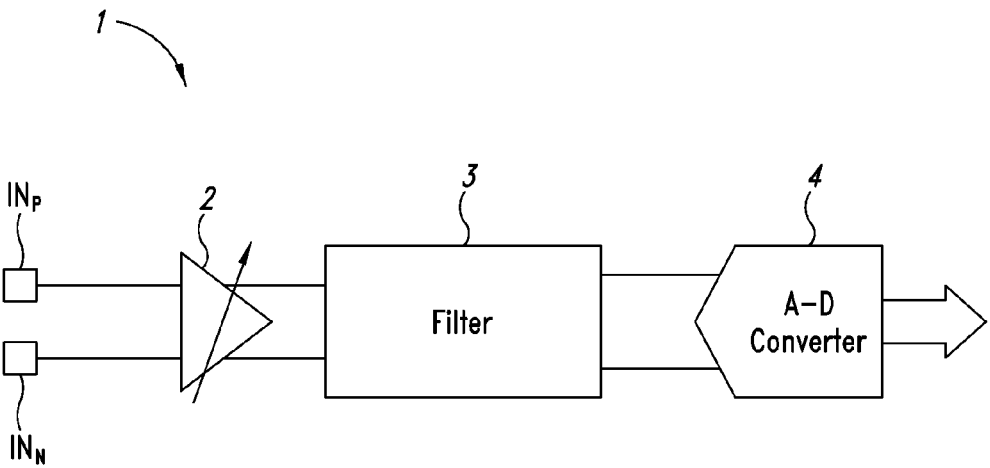
FIG. 1 shows a block diagram of a known system for processing a microphone signal.
Figure 2:
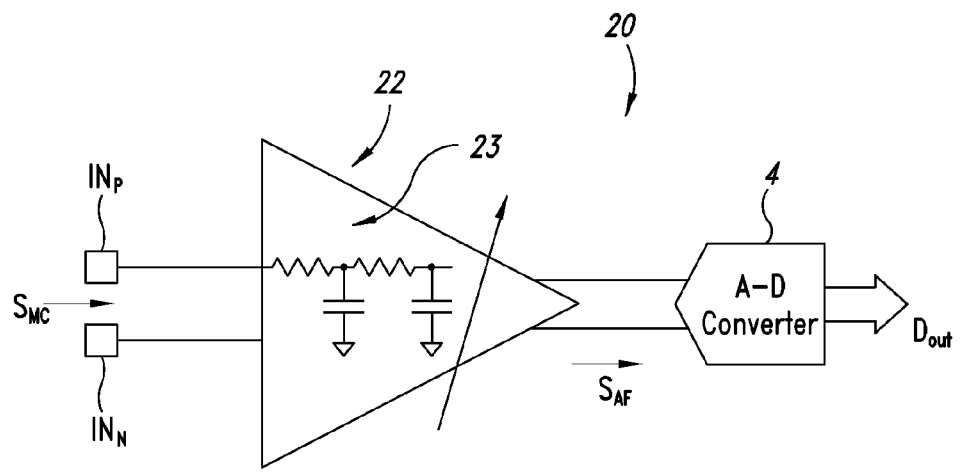
FIG. 2 shows a block diagram of a system for processing a microphone signal that includes an integrated amplifier and filter circuit and an analog-digital converter in accordance with the present disclosure.

With reference to FIG. 2, a system 20 for processing an analog signal $S_{MC}$ for amplifying, filtering and converting the signal $S_{MC}$ from analog to digital is illustrated in schematic form.

According to a preferred non limiting embodiment, the processing system 20 is a system for transmission or recording or both transmission and recording or receiving an analog voice/audio signal $S_{MC}$. In this case, the analog voice/audio signal $S_{MC}$ is for example an analog signal provided as an output by a microphone, not shown, such as in a mobile telephone or other communication device. In the example shown, such an analog voice/audio signal $S_{MC}$ is in particular a differential analog signal to be provided to inputs $IN_P$ and $IN_N$, of the processing system 20.

The system 20 includes an integrated programmable gain amplifier circuit 22, for receiving at input the analog signal $S_{MC}$. The circuit 22 includes an operational amplifier and a gain setup network 23 having resistive and selection elements, which interact with the resistive controllable elements in order to set, i.e., program, the gain of the integrated amplifier circuit 22. In the particular example shown, since the analog signal $S_{MC}$ is directly provided at output by the microphone, the integrated programmable gain amplifier circuit 22 is typically called a pre-amplifier circuit.

The gain setup network 23 also includes capacitor elements for defining, together with the resistive elements of the gain setup network and with the operational amplifier an anti-aliasing filter of the active RC type. The programmable gain amplifier circuit, or pre-amplifier, 22 is therefore able to output an amplified and filtered signal $S_{AF}$. According to an embodiment, above the active RC anti-aliasing filter is a two pole low pass filter.

The system 20 also includes an analog-digital converter 4, which is preferably provided on the same integrated circuit of the integrated amplifier circuit 22, for receiving at the input the amplified and filtered analog signal $S_{AF}$, and providing at the output the digital samples $D_{out}$, of the signal. Preferably, the analog-digital converter 4 is a switched capacitance sigma-delta converter, for example a 16 bit converter.

Figure 3:
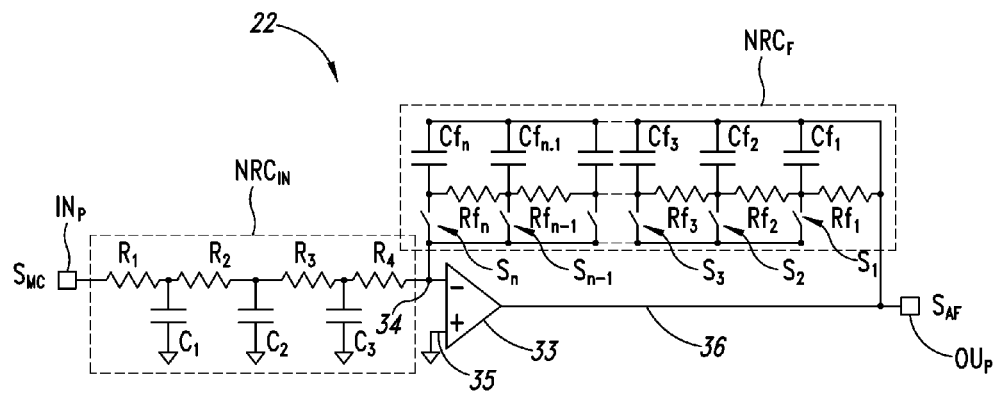
FIG. 3 shows the circuit diagram of an integrated programmable gain amplifier and filter circuit to be used in the system of FIG. 2.

In FIG. 3, a first embodiment of the integrated programmable gain amplifier circuit 22 is shown, in a particular example, wherein the circuit 22, unlike the programmable and differential amplifier circuit 22 of FIG. 2, is of the single-ended type. The integrated programmable gain amplifier circuit 22 includes an input terminal $IN_P$ for receiving at input the analog signal $S_{MC}$ and an output terminal $OU_P$ at which the amplifier circuit 22 provides a filtered and amplified analog signal $S_{AF}$.

The integrated amplifier circuit 22 includes an operational amplifier 33 preferably of the low noise type (operational amplifier LNA).

The operational amplifier 33 includes an inverting input 34, a non inverting input 35 connected to ground, and an output 36.

The integrated amplifier circuit 22 includes a gain setup network $NRC_{IN}$, $NRC_F$, including resistive elements, or resistors, $R_1$-$R_4$ and $Rf_1$-$Rf_n$, and selection elements $S_1$-$S_n$, which interact with the resistive elements and are controllable for example by a logic signal output by a suitable register (not shown), for setting up the gain of integrated amplifier circuit 22. The selection elements $S_1$-$S_n$ are preferably CMOS switches. According to a modification, the selection elements $S_1$-$S_n$ are MOS switches, either re-channel (N-ch) or p-channel (P-ch).

The gain setup network $NRC_{IN}$, $NRC_F$, includes a first network $NRC_{IN}$, or input network $NRC_{IN}$, which is connected on the input side to the operational amplifier 33. In this example it is connected to the inverting input 34 of operational amplifier 33. A second network $NRC_F$, or feedback network, is connected between the output 36 and input 34 of operational amplifier 33. In the example of FIG. 3, the feedback network $NRC_F$ is connected between the output 36 and input 34 of operational amplifier 33 and therefore defines the feedback loop of such operational amplifier 33.

The selection elements $S_1$-$S_n$ allow varying the ratio between the total resistance of feedback network $NRC_F$ and total resistance of input network $NRC_{IN}$, therefore allowing programming the gain of amplifier circuit 22. In an advantageous embodiment, the selection elements $S_1$-$S_n$ are included in the feedback network $NRC_F$, therefore allowing the setup of value of total resistance over the feedback loop of operational amplifier 33.

Advantageously, the gain setup network $NRC_{IN}$, $NRC_F$ also includes capacitor elements for defining, along with the resistive elements $R_1$-$R_4$ and $Rf_1$-$Rf_n$ and the operational amplifier 33, an active RC anti-aliasing filter. Preferably, such filter is a second order active RC filter. Therefore it can be deduced that the integrated programmable gain amplifier circuit 22 is an amplification and filtering circuit.

Preferably, the input network $NRC_{IN}$ includes one or more capacitor elements $C_1$-$C_3$ and one or more resistive elements $R_1$-$R_4$ for defining together an RC filter, more preferably a single-pole filter, provided at the input of operational amplifier 33. In a particularly advantageous embodiment, such RC filter is of the distributed kind, so that the input network $NRC_{IN}$ has many RC cells, respectively ($R_1$, $C_1$), ($R_2$, $C_2$), and ($R_3$, $C_3$), which are cascode-connected and preferably include resistive elements $R_1$, $R_2$, $R_3$ with the same resistance value and capacitor elements $C_1$, $C_2$, $C_3$ having the same capacitance. This allows the operational amplifier 33 to have at input a single-pole filter which is more selective with respect to the RC filter, which is only provided with a single RC cell.

In the particularly preferred embodiment of FIG. 3, the input network $NRC_{IN}$ includes three cascode-connected RC cells, and a resistance $R_4$ connected between the last cell $R_3$, $C_3$ and input 34, which is an inverting input in this example, of the operational amplifier 33.

The feedback network $NRC_F$ includes a plurality of RC cells, which are connected in a cascode ($Rf_1$, $Cf_1$), ($Rf_2$, $Cf_2$), ..., ($Rf_n$, $Cf_n$) and each of them is associated with a respective selection element $S_1$, ... $S_n$, so that selectively closing only one at a time of the selection elements $S_1$, ... $S_n$ it is possible to vary the number of RC cells that are cascode-connected between the output 36 and input 34 of operational amplifier 33, and therefore vary the number of RC cells that define the feedback loop of the operational amplifier 33. For example, by activating, i.e., closing the switch, of selection element $S_1$ and leaving all other selection elements $S_2$, ... $S_n$ open, the feedback loop will only include one RC cell, i.e., the RC cell ($Rf_1$, $Cf_1$) connected between the output 36 and the input 34 of the operational amplifier 33. In an analogous way, by activating, i.e., closing the switch, of selection element $S_2$ and leaving all other selection elements $S_1$ and $S_3$, ... $S_n$ open, the feedback loop will have two cascode-connected RC cells, i.e., RC cell ($Rf_1$, $Cf_1$) and cell ($Rf_2$, $Cf_2$) connected between the output 36 and the input 34 of the operational amplifier 33. In this way, since, based on the particular activated selection element, it is possible to determine the total resistance retroactively connected to the operational the amplifier 33, it is possible to set the gain of amplifier circuit 22.

In a particularly advantageous embodiment, the resistance and capacitance values of capacitive and resistive elements of the feedback network $NRC_F$ are defined in the design phase so that, independently from the number of RC cells ($Rf_1$, $Cf_1$), ($Rf_2$, $Cf_2$), ..., ($Rf_n$, $Cf_n$) which are cascode-connected between the output 36 and input 34 of operational amplifier 33, the feedback network $NRC_F$ defines the other one of the two poles of the anti-aliasing filter, the feedback network $NRC_F$ being describable by a passive RC filter with a single pole having a substantially constant cut-off frequency. In order to achieve this, it is sufficient that in the RC cells the capacitance values are proportionally scaled with respect to the value of associated resistances.

In this way, advantageously, the cut-off frequency of the anti-aliasing filtering implemented by the integrated amplifier circuit 22 may be set at a substantially constant value with respect to a set gain variation. Based on these specifications, when the cut-off frequency of RC filter defined by the feedback network $NRC_F$ is set, and once the desired pitch and range of gain variation are defined, one skilled in the art may easily determine, in the design phase, the number of RC cells of the feedback network $NRC_F$ and the values to be selected for the capacitive and resistive elements of such network $NRC_F$, which may be completely different from one another.

Figure 4:
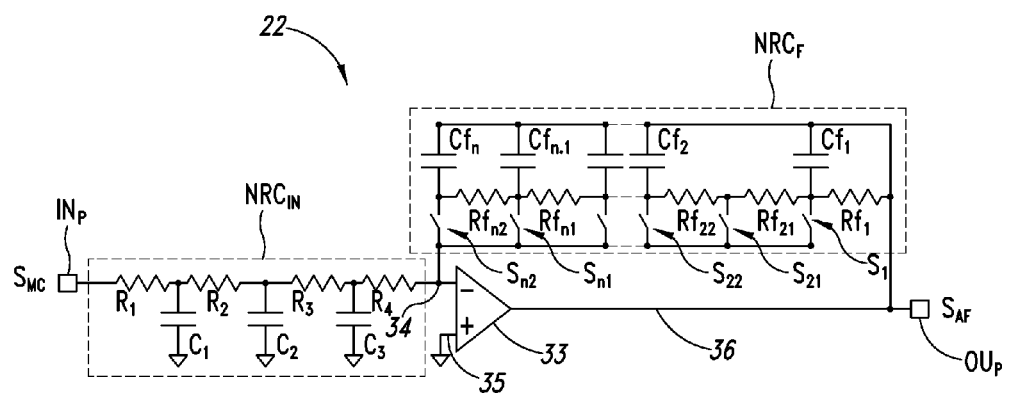
FIG. 4 shows a circuit diagram of an integrated programmable gain amplifier and filter circuit to be used in the system of FIG. 2.

With reference to FIG. 4, according to a modified embodiment, the integrated programmable gain amplifier circuit 22 includes a feedback network $NRC_F$ having a plurality of cascode-connected RC cells, wherein at least one of the RC cells has a capacitive element, at least two resistive elements, which may be independently series-connected between the input 34 and output 36 of operational amplifier 33 by means of respective independently controllable selection elements, which are provided in the feedback network $NRC_F$. In the particularly preferred embodiment of FIG. 4, with the exception of the first RC cell $Rf_1$, $Cf_1$, all the remaining RC cells of the feedback network $NRC_F$ include a capacitive element and two resistive elements, which may be connected between the output 36 and input 34 of operational amplifier 33 by means of respective independently controllable selection elements. In this regard, it is to be noted that in FIG. 4 the second RC cell ($Rf_{21}$, $Rf_{22}$, $Cf_2$) includes a capacity $Cf_2$ and two series connected resistors $Rf_{21}$, $Rf_{22}$, which may be independently connected between the input and output of operational amplifier by means of respective selection elements $S_{21}$, $S_{22}$ in order to vary the gain of integrated programmable gain amplifier circuit 22. It is to be noted that also in the integrated amplifier circuit 22 of FIG. 4, in order to set the gain value, it is necessary to close only one of the selection elements $S_1$, ... $S_{n2}$.

It is to be noted that by providing a plurality of resistances for each RC cell, as described above, and accepting a reasonably lower precision in maintaining a constant cut-off frequency in the feedback network $NRC_F$, and in general of anti-aliasing filtering implemented in the integrated programmable gain amplifier circuit 22, it is possible to provide an integrated programmable gain amplifier circuit 22 that, having less capacitive elements than the circuit of FIG. 3, requires a reduced surface area with respect to the latter.

Figure 5:
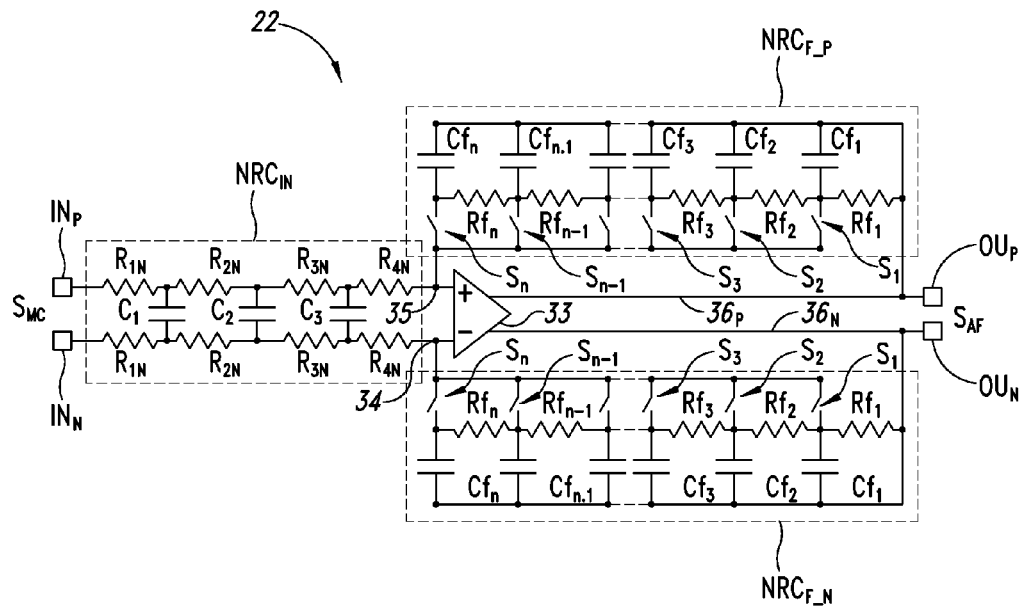
FIG. 5 shows the circuit diagram of an integrated programmable gain amplifier and filter circuit to be used in the system of FIG. 2.

FIG. 5 shows an integrated programmable gain amplifier circuit 22 that is very similar to the one shown in FIG. 3, wherein the circuit is of the fully-differential type.

In this case, the operational amplifier 33 is of a differential type, and has two inputs 34, 35 and two output $36_P$, $36_N$. The gain-setting network includes an input network $NRC_{IN}$ and two feedback networks $NRC_{F\_P}$ and $NRC_{F\_N}$.

The input network $NRC_{IN}$ has three cascode-connected RC cells, which are similar to those previously described, wherein, since the two inputs 34, 35 of the operational amplifier 33 are virtual ground nodes, each of such RC cells has one capacitive element and two resistive elements. The input network $NRC_{IN}$ defines a single pole RC filter. Each of the two feedback networks $NRC_{F\_P}$ and $NRC_{F\_N}$ embodies a multi-cell single pole RC filter and the capacitive and resistive elements are defined so that the cut frequency of the anti-aliasing filtering is substantially constant with respect to a gain variation in the integrated amplifier circuit 22.

All in all, the integrated amplifier circuit 22 is a programmable gain integrated differential amplifier circuit, which is also an anti-aliasing differential active filter of the second order, of the low pass type. It is to be noted that in order to set the gain in the integrated circuit 22 of FIG. 5, only one of the selection elements $S_1$, ... $S_n$ of feedback network $NRC_{F\_P}$ has to be activated, for example by a control circuit (not shown) through a register, for example activating the selection element $S_1$, and the corresponding selection element, i.e., $S_1$, and only this one in the other feedback network $NRC_{F\_N}$.

Figure 6:
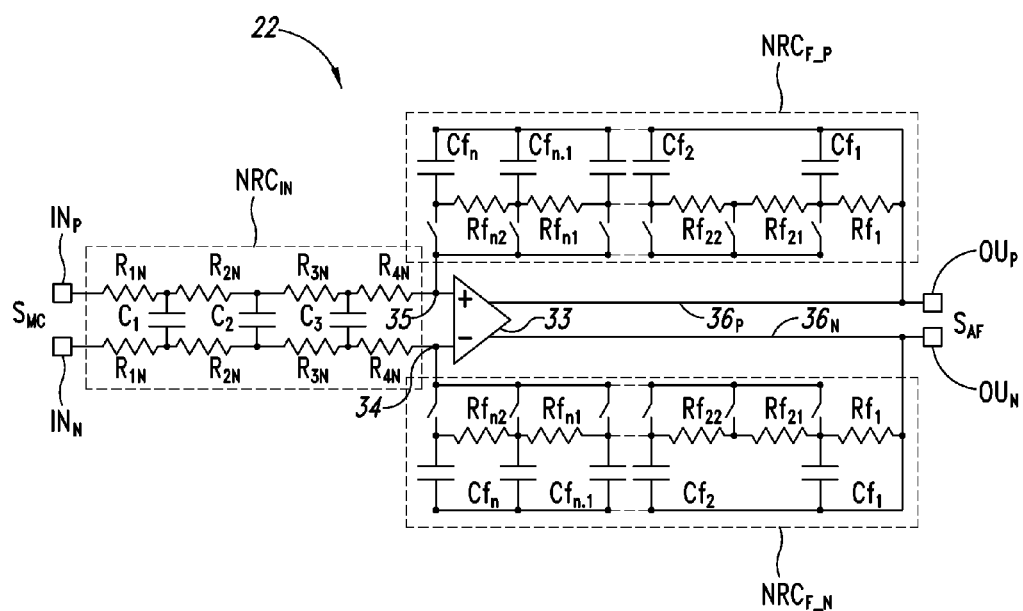
FIG. 6 shows the circuit diagram of an integrated programmable gain amplifier and filter circuit to be used in the system of FIG. 2.

Finally, FIG. 6 shows a modification of amplifier circuit of FIG. 5, wherein, in analogy to the description of the circuit of FIG. 4, for the single-ended case, the number of capacitive elements to be provided in the feedback networks $NRC_{F\_P}$ and $NRC_{F\_N}$ may be reduced.

From the above description, it is therefore possible to understand how a integrated programmable gain amplifier circuit 22 of above the type achieves the intended objects, allowing a reduction of surface area, by integrating the programmable gain amplification function and the anti-aliasing filtering function, and at the same time maintaining a substantially constant cut frequency of the anti-aliasing filtering, with respect to a variation in the particular gain to be set.

Obviously, the skilled in the art, in order to satisfy contingent and specific needs may introduce various modifications and variations to the above integrated programmable gain amplifier circuit and analog signal processing system, which all remain within the protection scope of the disclosure, as defined in the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated programmable gain amplifier circuit, which is structured to receive at an input an analog signal, the circuit comprising: an operational amplifier and a gain setup network having resistive elements and selection elements that are structured to be controlled to setup gain of the amplifier circuit, the gain setup network having capacitive elements that, together with the resistive elements and the operational amplifier are structured to define an anti-aliasing filter of the active RC type in which a plurality of resistors and capacitors are cascode connected and selectively coupled together to provide a variable gain to the circuit.

2. The integrated programmable gain amplifier circuit of claim 1, wherein the anti-aliasing filter is a second order RC filter.

3. The integrated programmable gain amplifier circuit of claim 1, wherein the gain setup network includes a first network, or input network, which is connected to an input of the operational amplifier, and a second network, or feedback network, which is connected to an output of the operational amplifier and the input of the operational amplifier, and wherein the selection elements are structured to allow varying the ratio between a total resistance of the feedback network and a total resistance of the input network, thereby allowing programming of amplifier circuit gain.

4. The integrated programmable gain amplifier circuit of claim 3, wherein the selection elements are included in the feedback network and are structured to selectively determine a total series resistance value between the output and the input.

5. The integrated programmable gain amplifier circuit of claim 4, wherein the feedback network includes a plurality of the RC cells connected to each other to form a cascode, each one of the RC cells associated with a respective selection element so that by selectively activating only one of the selection elements, one at a time, the number of RC cells cascode-connected between the output and the input of the operational amplifier can be varied.

6. The integrated programmable gain amplifier circuit of claim 5, wherein the plurality of cascode-connected RC cells includes at least an RC cell having a capacitive element, at least two resistive elements, and at least two independently controllable selection elements that are each associated with one of the at least two resistive elements, the at least two resistive elements structured to be independently series-connectable between the input and output of the operational amplifier by means of the independently controllable selection elements.

7. The integrated programmable gain amplifier circuit of claim 3, wherein the input network includes one or more capacitive elements and one or more resistive elements that are structured to define, as a whole, an RC filter positioned at the input of the operational amplifier.

8. The integrated programmable gain amplifier circuit of claim 7, wherein the RC filter is of the distributed type, so that the input network includes a plurality of cells cascode-connected to each other and provided with resistive elements having the same resistance and capacitive elements having the same capacitance.

9. The integrated programmable gain amplifier circuit of claim 1 wherein the resistive elements and the capacitive elements have resistance and capacitance values so that a cut-off frequency of the anti-aliasing filter is constant with respect to a gain variation of the amplifier circuit.

10. The integrated programmable gain amplifier circuit of claim 1, further including an analog-digital converter, which is connected at the output of the operational amplifier.

11. A circuit for processing an analog signal, the circuit comprising:
an anti-aliasing filter of the active RC type that includes:
an amplifier; and
a gain network that includes an input network coupled to a first input of the amplifier, and a feedback network coupled between an output of the amplifier and a second input of the amplifier, the feedback network having a plurality of RC cells coupled in cascode, each RC cell coupled to a respective selection switch that is structured to selectively couple each of the plurality of RC cells in the cascode connection to vary a ratio of total resistance of the feedback network to a total resistance of the input network.

12. The circuit of claim 11, further including an analog-to-digital converter coupled to an output of the amplifier.

13. The circuit of claim 11, wherein the programmable gain amplifier is a fully differential amplifier having a second feedback network coupled between a second output of the amplifier and the first input of the amplifier.

14. A mobile communications device, comprising:
an anti-aliasing filter of the active RC type that includes:
an amplifier; and
a gain network that includes an input network coupled to a first input of the amplifier, and a feedback network coupled between an output of the amplifier and a second input of the amplifier, the feedback network having a plurality of RC cells coupled in cascode, each RC cell coupled to a respective selection switch that is structured to selectively couple each of the plurality of RC cells in the cascode connection to vary a ratio of total resistance of the feedback network to a total resistance of the input network.

15. The mobile communications device of claim 14, further including an analog-to-digital converter coupled to an output of the amplifier.

16. The mobile communications device of claim 14, wherein the programmable gain amplifier is a fully differential amplifier having a second feedback network coupled between a second output of the amplifier and the first input of the amplifier.

17. An integrated programmable gain amplifier circuit, which receives at an input an analog signal, the circuit comprising: an operational amplifier and a gain setup network having resistive elements and selection elements that are controlled to setup gain of the amplifier circuit,
the gain setup network having capacitive elements, together with the resistive elements and the operational amplifier that is structured to define an anti-aliasing filter of the active RC type,
wherein the gain setup network includes a first network, or input network, which is connected to an input of the operational amplifier and a second network, or feedback network, which is connected to an output of the operational amplifier, and the input of the operational amplifier, and wherein the selection elements are structured to allow varying the ratio between a total resistance of the feedback network and a total resistance of the input network, thereby allowing programming of amplifier circuit gain.

18. The integrated programmable gain amplifier circuit of claim 17, wherein the anti-aliasing filter is a second order RC filter.

19. The integrated programmable gain amplifier circuit of claim 17, wherein the selection elements are included in the feedback network and are structured to selectively determine a total series resistance value between the output and the input, and wherein the feedback network includes a plurality of the RC cells connected to each other to form a cascode, each one of the RC cells associated with a respective selection element and structured so that by activating only one of the selection elements, one at a time, the number of RC cells cascode-connected between the output and the input of the operational amplifier can be varied.

20. The integrated programmable gain amplifier circuit of claim 19, wherein the plurality of cascode-connected RC cells includes at least an RC cell having a capacitive element, at least two resistive elements, and at least two independently controllable selection elements that are each associated with one of the at least two resistive elements, the at least two resistive elements structured to be independently series-connectable between the input and output of the operational amplifier by means of the independently controllable selection elements.

21. The integrated programmable gain amplifier circuit of claim 17, wherein the input network includes one or more capacitive elements and one or more resistive elements structured to define, as a whole, an RC filter at the input of operational amplifier.

22. The integrated programmable gain amplifier circuit of claim 17, wherein the RC filter is of the distributed type, and the input network includes a plurality of cells cascode-connected to each other and provided with resistive elements having the same resistance and capacitive elements having the same capacitance.

* * * * *